(12) United States Patent
Cui et al.

(10) Patent No.: US 11,251,292 B2
(45) Date of Patent: Feb. 15, 2022

(54) HIGH ELECTRON MOBILITY TRANSISTOR

(71) Applicant: Qorvo US, Inc., Greensboro, NC (US)

(72) Inventors: Yongjie Cui, Plano, TX (US); Yu Cao, Allen, TX (US); Andrew Arthur Ketterson, Dallas, TX (US)

(73) Assignee: QORVO US, INC., Greensboro, NC (US)

( * ) Notice: Subject to any disclaimer, the term of this patent is extended or adjusted under 35 U.S.C. 154(b) by 0 days.

(21) Appl. No.: 16/879,381

(22) Filed: May 20, 2020

(65) Prior Publication Data

US 2020/0373419 A1 Nov. 26, 2020

Related U.S. Application Data

(60) Provisional application No. 62/850,796, filed on May 21, 2019.

(51) Int. Cl.
*H01L 29/778* (2006.01)
*H01L 29/423* (2006.01)
*H01L 29/20* (2006.01)
*H01L 29/10* (2006.01)
*H01L 29/06* (2006.01)

(52) U.S. Cl.
CPC ...... *H01L 29/7783* (2013.01); *H01L 29/0649* (2013.01); *H01L 29/1033* (2013.01); *H01L 29/2003* (2013.01); *H01L 29/4236* (2013.01)

(58) Field of Classification Search
CPC ............. H01L 29/7783; H01L 29/2003; H01L 29/4236; H01L 29/0657; H01L 29/42316; H01L 29/1033; H01L 29/0649

USPC .................. 257/194, 409; 438/172, 478, 572
See application file for complete search history.

(56) References Cited

U.S. PATENT DOCUMENTS

2019/0013386 A1* 10/2019 Shinohara et al. ......................... H01L 29/42316

OTHER PUBLICATIONS

Inoue, K., et al. "Linearity Improvement of GaN HEMT for RF Power Amplifiers," 2013 IEEE Compound Semiconductor Integrated Circuit Symposium (CSICS), Monterey, Calif., 2013, 4 pages.
Joglekar, S., et al., "High Linearity GaN-Transistors for RF and High Power Amplification", MTL Annual Research Report, 2017, p. 48. https://mtlsites.mit.edu/annual_reports/2017/electronic_devices.pdf.

(Continued)

*Primary Examiner* — Thinh T Nguyen
(74) *Attorney, Agent, or Firm* — Withrow & Terranova, P.L.L.C.

(57) ABSTRACT

A high electron mobility transistor is disclosed. The high electron mobility transistor has a gallium nitride layer with a plurality of two-dimensional electron gas channels, wherein the gallium nitride layer is disposed over a substrate. A gate contact has a gate bus disposed over the gallium nitride layer. The gate bus includes a plurality of gate feet extending from the gate bus into the gallium nitride layer. Each gate foot of the plurality of gate feet has a trapezoid-shaped cross-section with a longer base and a shorter base in parallel with a longitudinal axis of the gate bus. A source contact is disposed over the gallium nitride layer, and a drain contact is disposed over the gallium nitride layer, wherein the source contact and the drain contact are spaced apart from the gate contact and each other.

20 Claims, 15 Drawing Sheets

(56) References Cited

OTHER PUBLICATIONS

Joglekar, S., et al., "Large signal linearity enhancement of AlGaN/GaN high electron mobility transistors by device-level VT engineering for transconductance compensation," IEDM, Dec. 2017, pp. 25.3.1 to 25.3.4.

Park, P.S., et al. "Electron gas dimensionality engineering in AlGaN/GaN high electron mobility transistors using polarization," Applied Physics Letters 100, 2012, pp. 063507-1 to 063507-3.

Shinohara, K., et al., "Development of High-Power High-Linearity GaN BRIDGE FETs with Laterally Gated Multi-2DEG Channels," 2018 Lester Eastman Conference on High Performance Devices, Columbus, Ohio, Aug. 2018, 3 pages.

Shinohara, K., et al., "GaN-Based Field-Effect Transistors with Laterally Gated Two-Dimensional Electron Gas," Electron Device Letters IEEE, 2018, 4 pages.

Zhang, K., et al., "High-linearity AlGaN/GaN FinFETs for microwave power applications," IEEE Electron Device Letters, vol. 38, No. 5, May 2017, pp. 615-618.

\* cited by examiner

| 2DEG CHANNEL | CHANNEL WIDTH 64° SIDEWALL (nm) | RELATIVE CHANNEL WIDTH | PINCH-OFF VOLTAGE |
|---|---|---|---|
| A | 176 | 0.70 | 1.9 |
| B | 194.5 | 0.78 | 2.1 |
| C | 213 | 0.85 | 2.3 |
| D | 231.5 | 0.93 | 2.5 |
| E | 250 | 1.0 | 2.7 |

FIG. 9

HIGH ELECTRON MOBILITY TRANSISTOR

RELATED APPLICATIONS

This application claims the benefit of provisional patent application Ser. No. 62/850,796, filed May 21, 2019, the disclosure of which is hereby incorporated herein by reference in its entirety.

FIELD OF THE DISCLOSURE

The present disclosure relates to field-effect transistors and in particular to high electron mobility transistors and methods of their manufacture.

BACKGROUND

At present, field-effect transistors such as high electron mobility transistors based upon gallium nitride semiconductor technology are desired by both commercial and military communication markets. The commercial communication market has particularly crowded communication bands. As such, there is a demand for highly linear high electron mobility transistors, especially in the millimeter wave communication bands allocated for fifth-generation (5G) cellular communications. Therefore, an unsatisfied need continually remains for highly linear high electron mobility transistors, and this need is particular acute for high electron mobility transistors based upon gallium nitride semiconductor technology.

SUMMARY

A high electron mobility transistor is disclosed. The high electron mobility transistor has a gallium nitride layer with a plurality of two-dimensional electron gas channels, wherein the gallium nitride layer is disposed over a substrate. A gate contact has a gate bus disposed over the gallium nitride layer. The gate bus includes a plurality of gate feet extending from the gate bus into the gallium nitride layer. Each gate foot of the plurality of gate feet has a trapezoid-shaped cross-section with a longer base and a shorter base in parallel with a longitudinal axis of the gate bus. A source contact is disposed over the gallium nitride layer, and a drain contact is disposed over the gallium nitride layer, wherein the source contact and the drain contact are spaced apart from the gate contact and each other. The source and drain contacts are typically made connecting all two-dimensional electron gas (2DEG) channels with metal or regrown layers.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 9 is a table listing exemplary channel widths, relative channel widths, and pinch-off voltages for the plurality of 2DEG channels depicted in FIG. 8.

DETAILED DESCRIPTION

Figure 1:
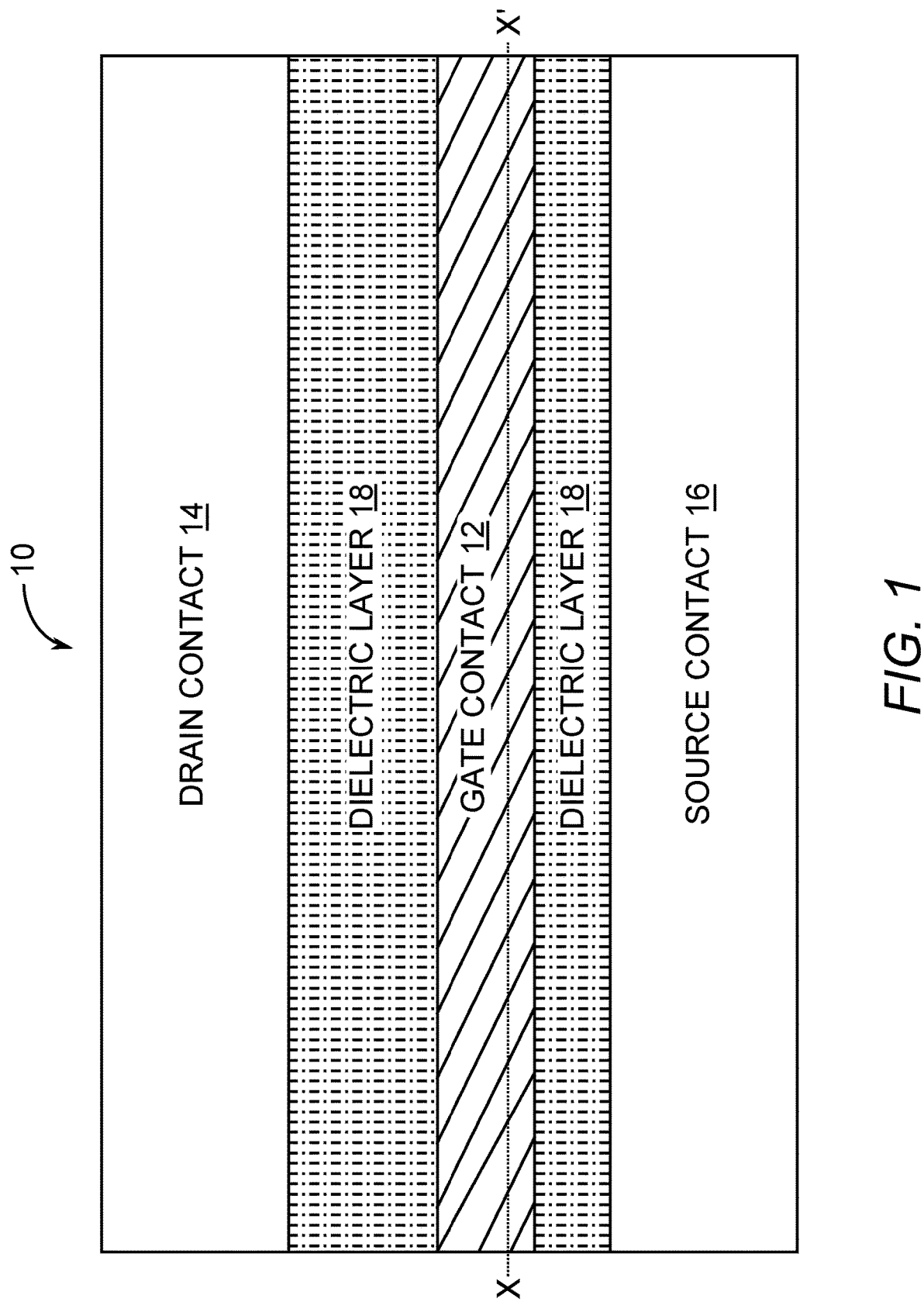
FIG. 1 is a top-side structural diagram of a high electron transistor of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a top-side structural diagram of an exemplary embodiment of a high electron mobility transistor 10 in accordance with the present disclosure. The high electron mobility transistor 10 has a gate contact 12, a drain contact 14, and a source contact 16, wherein the drain contact 14 and the source contact 16 are spaced apart from the gate contact 12 and each other. In this exemplary embodiment, spacing between the gate contact 12 and the drain contact 14 is greater than the spacing between the gate contact 12 and the source contact 16. A dielectric layer 18 provides electrical insulation between the gate contact 12, the drain contact 14, and the source contact 16. Typical dielectric materials for the dielectric layer 18 include, but are not limited to, silicon nitride and silicon dioxide. A dashed line represents a longitudinal axis X-X' for the gate contact 12 and sectional cutline for FIG. 2.

Figure 2:
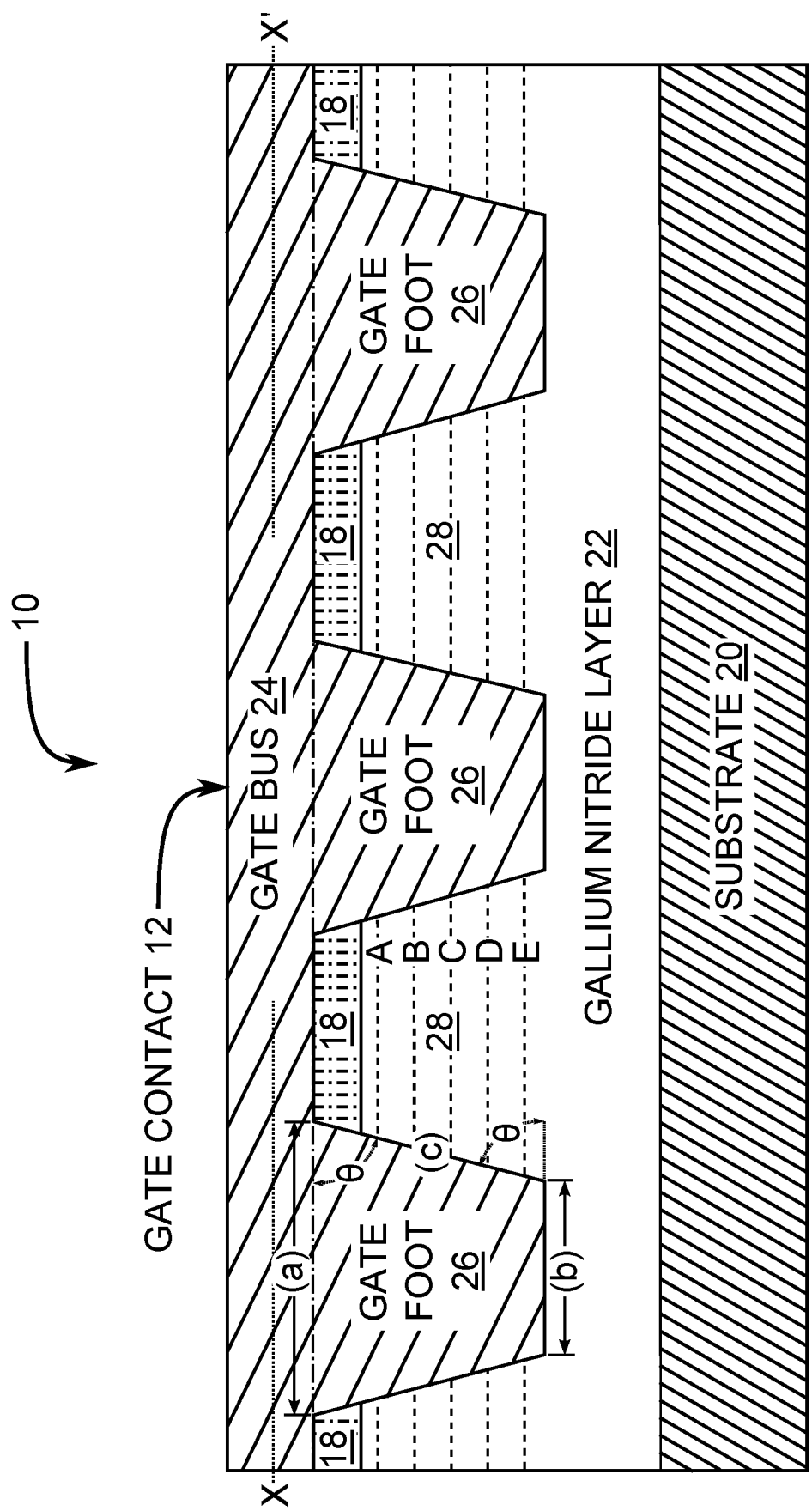
FIG. 2 is a cross-sectional structural diagram of a first exemplary embodiment of the high electron mobility transistor of the present disclosure.

FIG. 2 is a cross-sectional structural diagram of a first exemplary embodiment of the high electron mobility transistor 10 of FIG. 1. The high electron mobility transistor 10 has a substrate 20. Typical substrate materials include, but are not limited to, silicon dioxide, sapphire, and silicon carbide. A gallium nitride layer 22 is disposed over the substrate 20. The gate contact 12 comprises a gate bus 24 disposed over the gallium nitride layer 22. A plurality of gate feet 26 is integral with the gate bus 24. Each gate foot of the plurality of gate feet 26 extends from the gate bus 24 into the gallium nitride layer 22 to form a Schottky barrier type gate contact. Further still, each gate foot of the plurality of gate feet 26 has a trapezoid-shaped cross-section with a longer base (a) and a shorter base (b) in parallel with the longitudinal axis X-X' of the gate bus 24. In some embodiments, an angle $\Theta$ between the longer base (a) and an adjacent leg (c) of the trapezoid-shaped cross-section is between 45° and 80°. In other embodiments, the angle $\Theta$ between the longer base (a) and the adjacent leg (c) of the trapezoid-shaped cross-section is between 60° and 70°. A taper angle for each tapered channel region 28 is an alternate interior angle of the angle $\Theta$ between the longer base (a) and the adjacent leg (c) of the trapezoid-shaped cross-section. Thus, the angle $\Theta$ is also referred to herein as the taper angle $\Theta$ of each tapered channel region 28. A plurality of two-dimensional electron gas (2DEG) channels A, B, C, D, and E reside within each tapered channel region 28. It is to be understood that a greater number of 2DEG channels or a fewer number of 2DEG channels may reside within each tapered channel region 28 within the scope of the present disclosure.

During fabrication, the gallium nitride layer 22 is etched to form the tapered channel region 28, which is trapezoid-shaped. Notice also that in the embodiment of FIG. 2, the dielectric layer 18 extends under portions of the gate contact 12.

Figure 3:
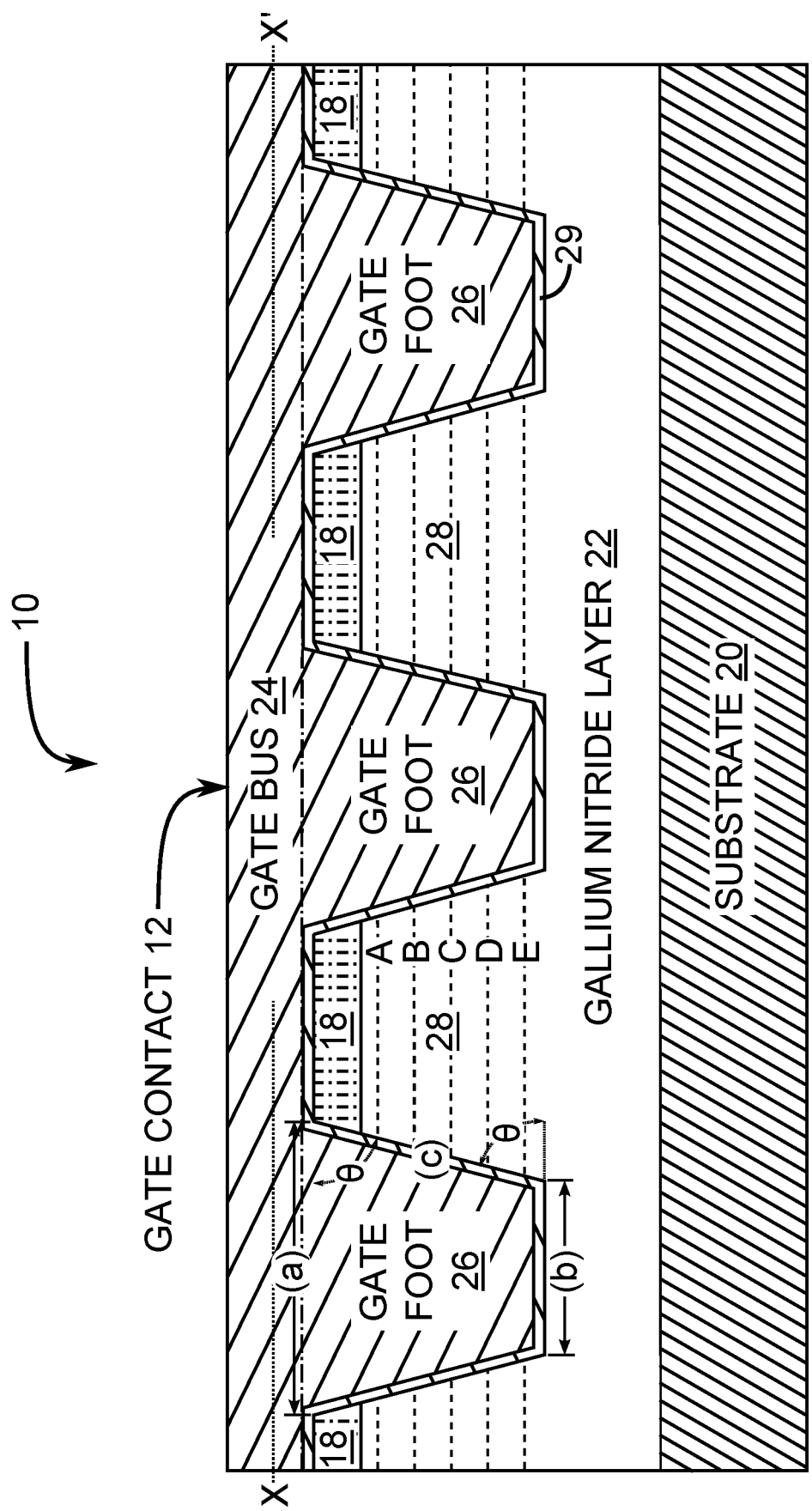
FIG. 3 is a cross-sectional structural diagram of the first exemplary embodiment of the high electron mobility transistor that further includes an insulation layer made of dielectric material.

FIG. 3 is a cross-sectional structural diagram of the first exemplary embodiment of the high electron mobility transistor 10 that further includes an insulation layer 29 made of dielectric material. Suitable dielectric materials include, but are not limited to, silicon nitride, silicon dioxide, and aluminum oxide. Typical thicknesses for the insulation layer 29 are between 5 nm and 200 nm. Other thickness ranges are within the scope of the present disclosure. The insulation layer 29 is disposed between the gate contact 12 and the gallium nitride layer 22 to form a metal-insulator-semiconductor type high electron mobility transistor.

Figure 4:
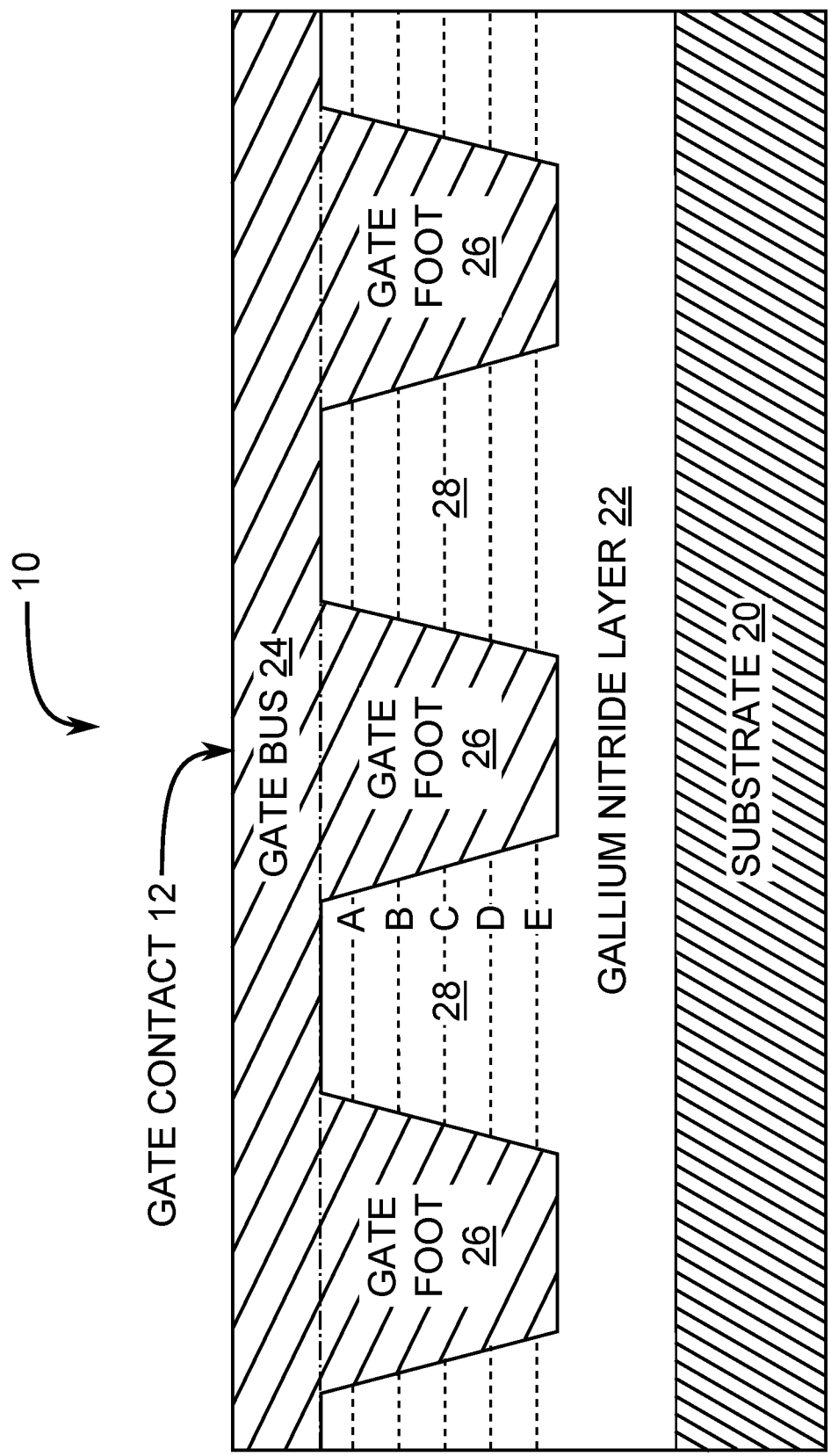
FIG. 4 is a cross-sectional structural diagram of a second exemplary embodiment of the high electron mobility transistor of the present disclosure.

FIG. 4 is a cross-sectional structural diagram of a second exemplary embodiment of the high electron mobility transistor 10 of the present disclosure. In this second exemplary embodiment, the gallium nitride layer 22 extends through each tapered channel region 28 such that a top of each tapered channel region 28 is directly against the gate bus 24 to form a Schottky barrier type gate contact.

Figure 5:
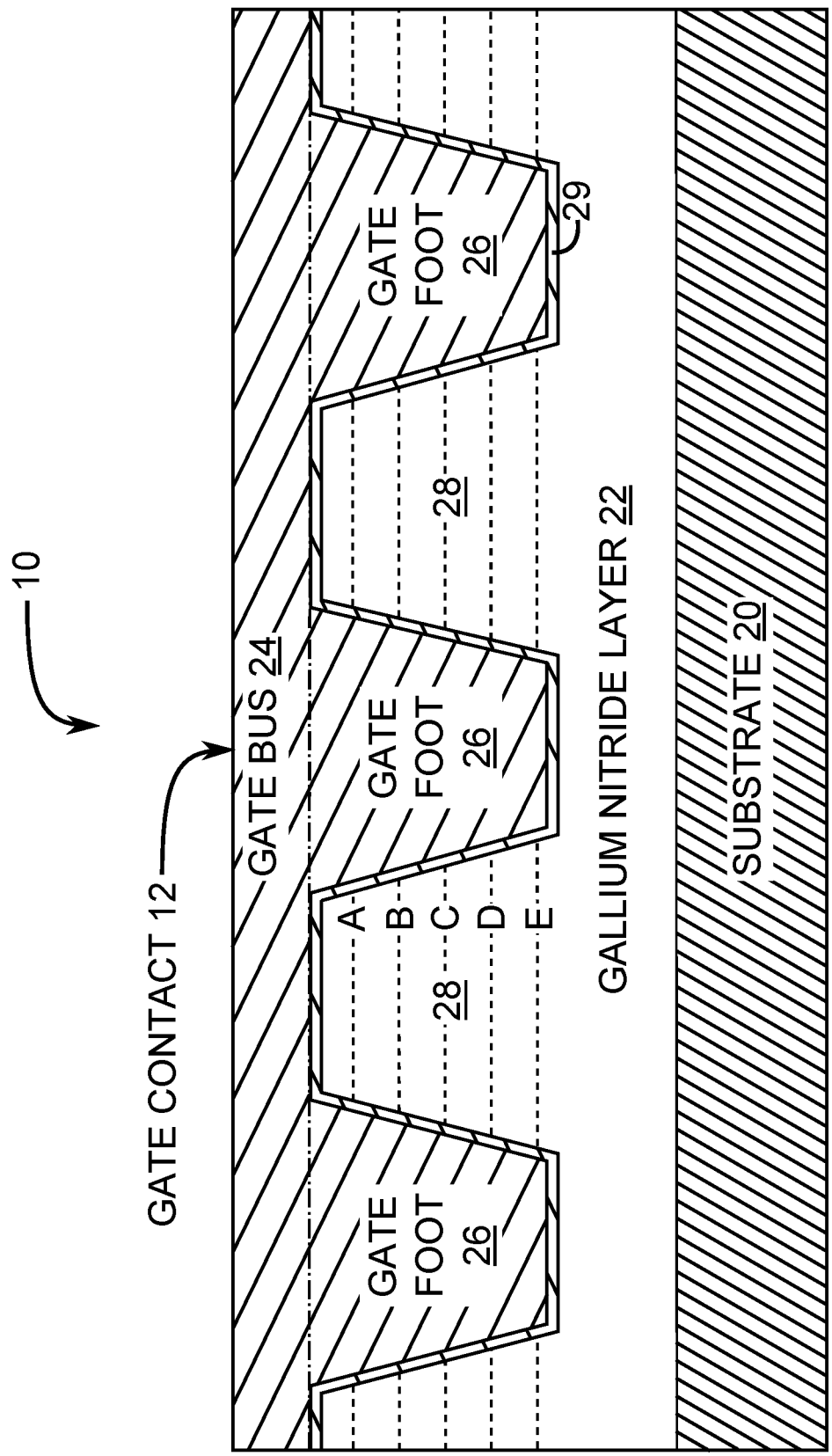
FIG. 5 is a cross-sectional structural diagram of the second exemplary embodiment of the high electron mobility transistor that further includes the insulation layer made of dielectric material.

FIG. 5 is a cross-sectional structural diagram of the second exemplary embodiment of the high electron mobility transistor that further includes the insulation layer 29 made of dielectric material. The insulation layer 29 is disposed between the gate contact 12 and the gallium nitride layer 22 to form a metal-insulator-semiconductor type high electron mobility transistor.

Figure 6:
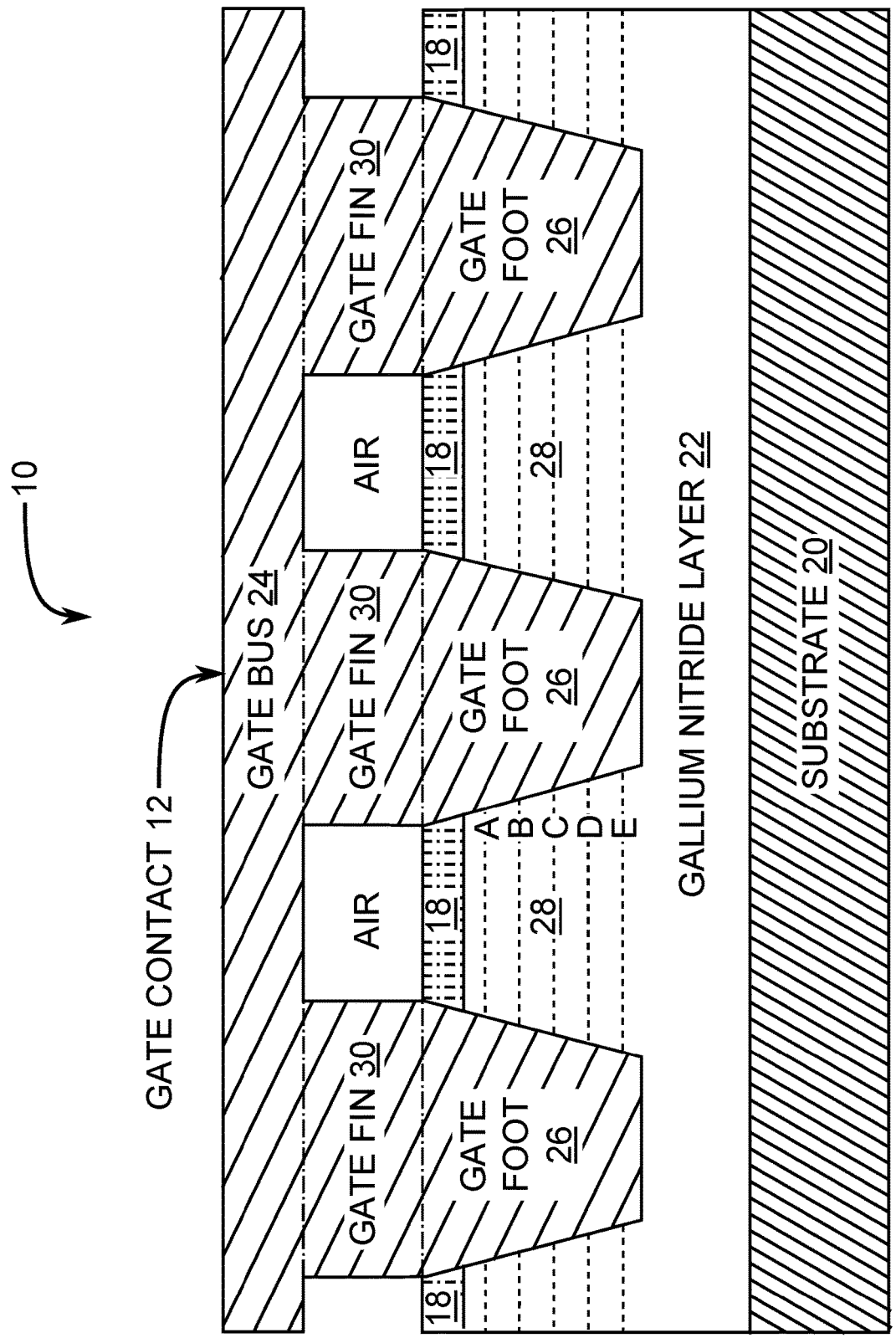
FIG. 6 is a cross-sectional structural diagram of a third exemplary embodiment of the high electron mobility transistor of the present disclosure.

FIG. 6 is a cross-sectional structural diagram of a third exemplary embodiment of the high electron mobility transistor 10 of the present disclosure. In this third exemplary embodiment a gate fin 30 spaces the gate bus 24 above the gallium nitride layer 22. Air may fill the space between portions of the gate bus 24 and the gallium nitride layer 22. Moreover, as depicted in FIG. 6, the dielectric layer 18 is sandwiched between portions of the gallium nitride layer 22 that extend through each tapered channel region 28 and the air. It is to be understood that the dielectric layer 18 may extend between the top of the tapered channel region 28 and a bottom surface of the gate bus 24. In this exemplary embodiment, the top of each of the tapered channel region 28 resides against the bottom surface of the gate bus 24 to form a Schottky barrier type gate contact.

Figure 7:
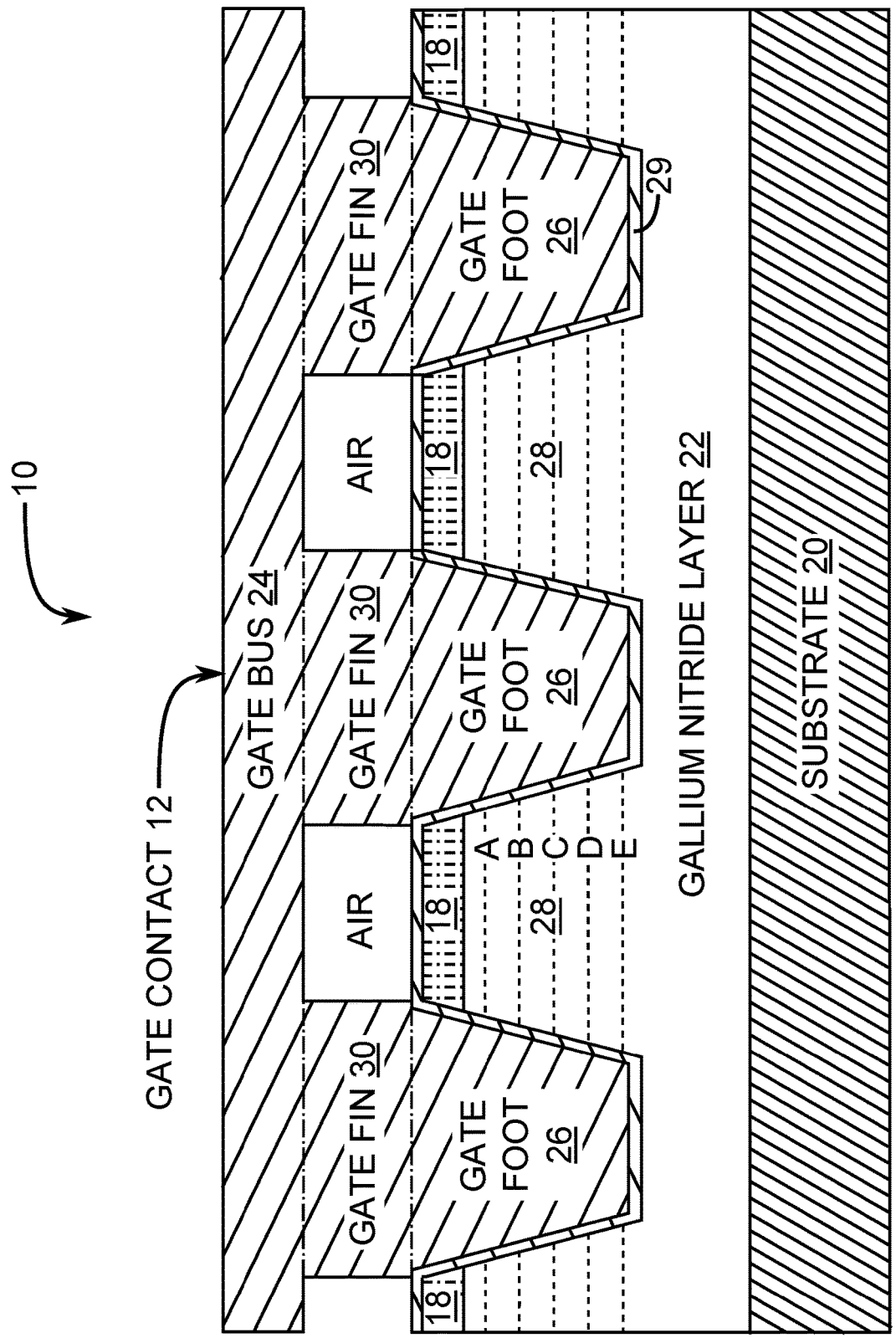
FIG. 7 is a cross-sectional structural diagram of the third exemplary embodiment of the high electron mobility transistor that further includes the insulation layer made of dielectric material.

FIG. 7 is a cross-sectional structural diagram of the third exemplary embodiment of the high electron mobility transistor that further includes the insulation layer 29 made of dielectric material. The insulation layer 29 is disposed between the gate contact 12 and the gallium nitride layer 22 to form a metal-insulator-semiconductor type high electron mobility transistor.

Figure 8:
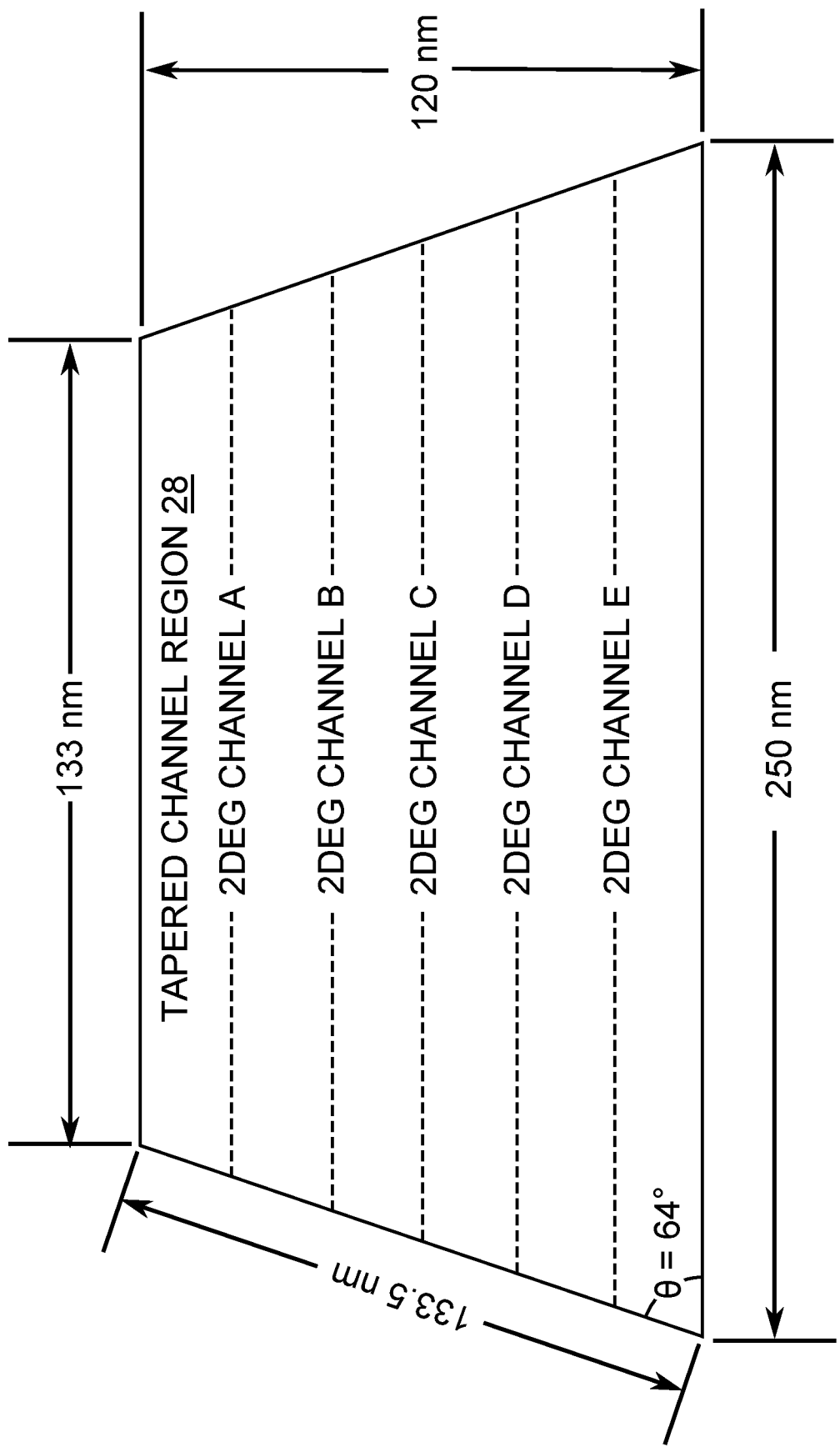
FIG. 8 is a cross-sectional structural diagram of a tapered channel region depicting a plurality of two-dimensional electron gas (2DEG) channels associated with the high electron mobility transistor of the embodiments depicted in FIGS. 2, 4, and 6.

FIG. 8 is a cross-sectional structural diagram of an exemplary embodiment of a tapered channel region 28 depicting the plurality of two-dimensional electron gas (2DEG) channels A, B, C, D, and E associated with the high electron mobility transistor 10 (FIGS. 2, 4, and 6). In FIG. 8, the tapered channel region 28 has a shorter base that is 133 nm in length, a longer base that is 250 nm in length, a height of 120 nm, and legs that are each 133.5 nm long. Thus, the taper angle Θ is 64° in this exemplary embodiment.

FIG. 9 is a table listing exemplary channel widths, relative channel widths, and pinch-off voltages for the plurality of 2DEG channels A, B, C, D, and E depicted in FIG. 8. An advantage of the high electron mobility transistor 10 is uniform current distribution between different ones of each tapered channel region 28 between pairs of the plurality of gate feet 26. This advantage is at least in part due to equidistant spacing between each gate foot of the plurality of gate feet 26. Moreover, as indicated by the table of FIG. 9 the plurality of 2DEG channels A, B, C, D, and E have different widths that are stacked vertically. As a result of the different widths of the plurality of 2DEG channels A, B, C, D, and E, uniform current distribution is maintained even as pinch-off voltages change. Further, the uniformity of current distribution provides improved thermal dissipation, which results in overall improved device performance.

Figure 10:
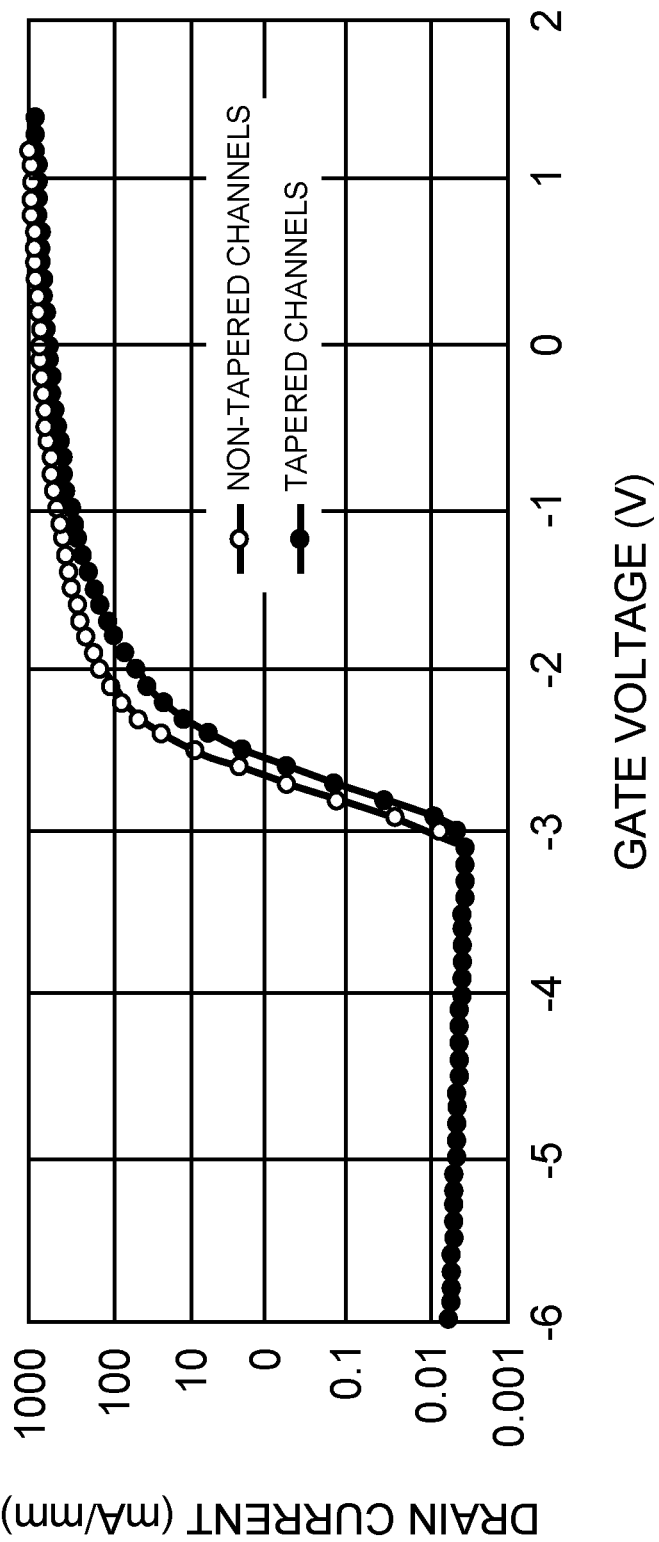
FIG. 10 is a graph of transfer curves of drain current versus gate voltage for each tapered channel region between pairs of the plurality of gate feet in comparison with non-tapered channels.

FIG. 10 is a graph of transfer curves of drain current versus gate voltage for each tapered channel region 28 between pairs of the plurality of gate feet 26 in comparison with drain current within non-tapered channels. Notice that drain current within each tapered channel region 28 increases relatively slower with gate voltage increase in comparison with drain current within a non-tapered channel region.

Figure 11:
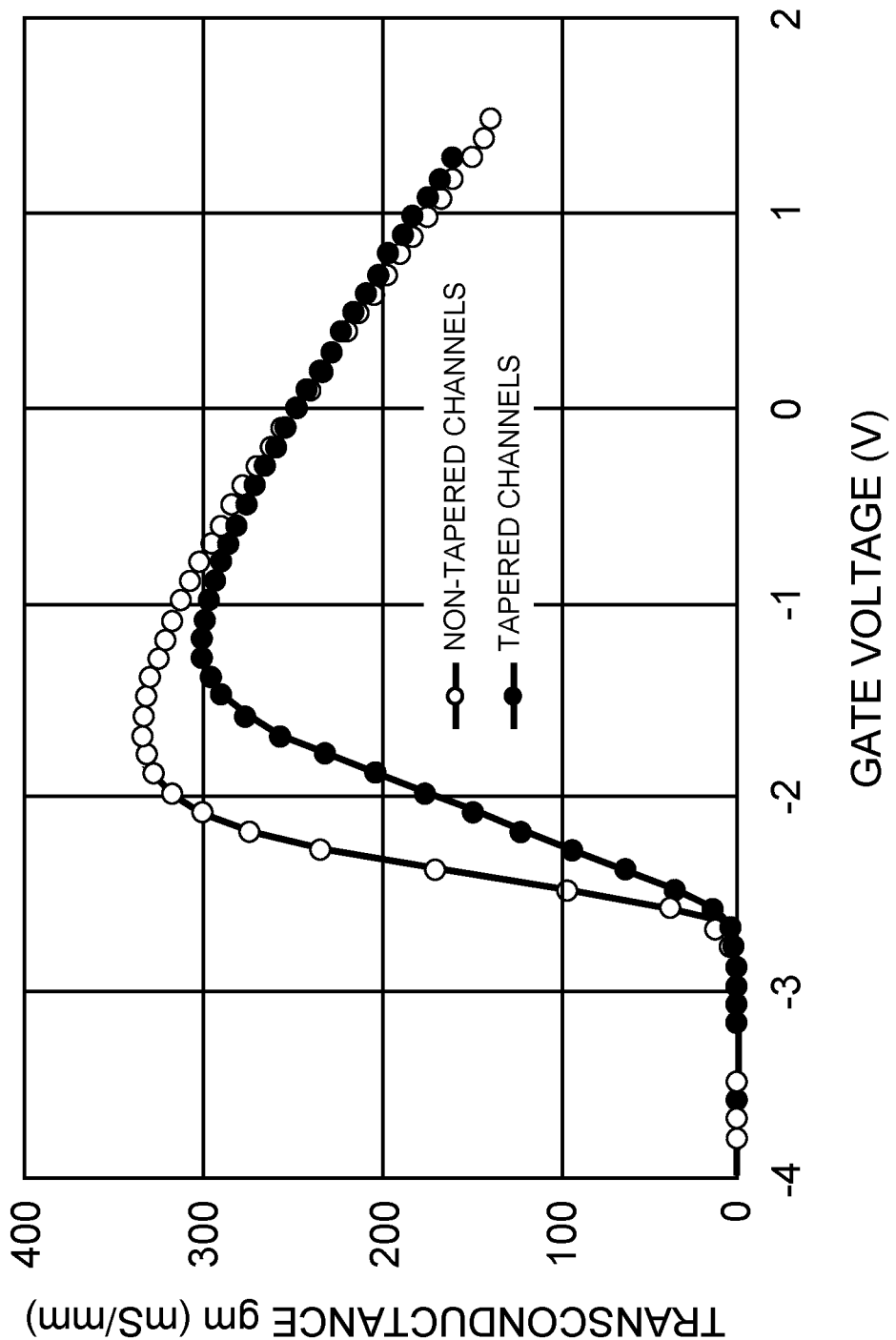
FIG. 11 is a graph of transfer curves of transconductance versus gate voltage for each tapered channel region between pairs of the plurality of gate feet in comparison with non-tapered channels.

FIG. 11 is a graph of transfer curves of transconductance versus gate voltage for each tapered channel region 28 between pairs of the plurality of gate feet 26 in comparison with transconductance associated with non-tapered channels. Notice that transconductance associated with each tapered channel region 28 increases relatively slower with gate voltage increase in comparison with transconductance associated with non-tapered channel regions.

Figure 12:
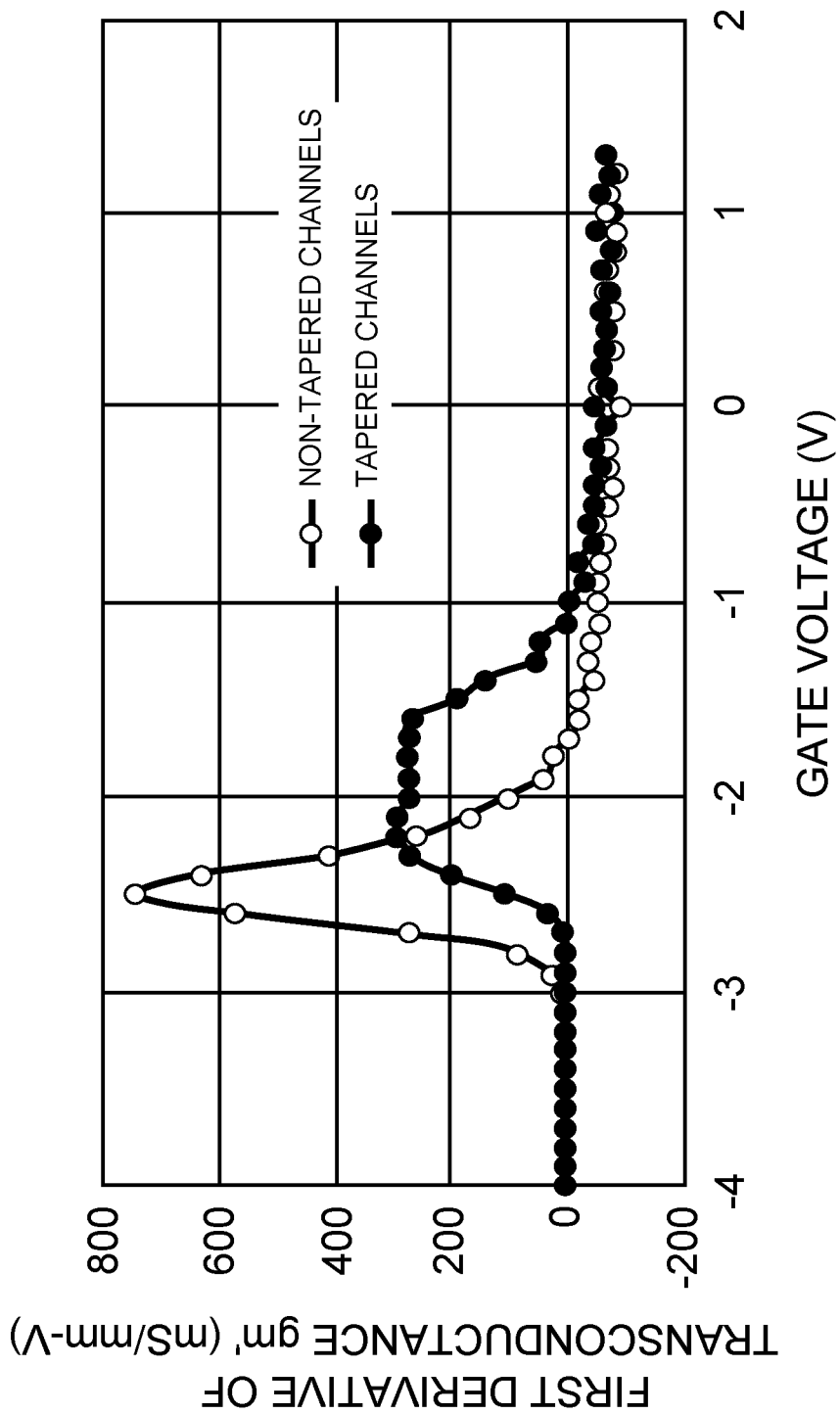
FIG. 12 is a graph of first derivative of transconductance versus gate voltage for a 64° taper angle for each tapered channel region between pairs of the plurality of gate feet in comparison with non-tapered channel regions.

FIG. 12 is a graph of first derivative of transconductance versus gate voltage for a 64° taper angle for each tapered channel region 28 between pairs of the plurality of gate feet 26 in comparison with the first derivative of transconductance associated with non-tapered channel regions. Notice that with each tapered channel region 28 the first derivative of transconductance is reduced by more than 50% in comparison with the first derivative of transconductance associated with non-tapered channel regions.

Figure 13:
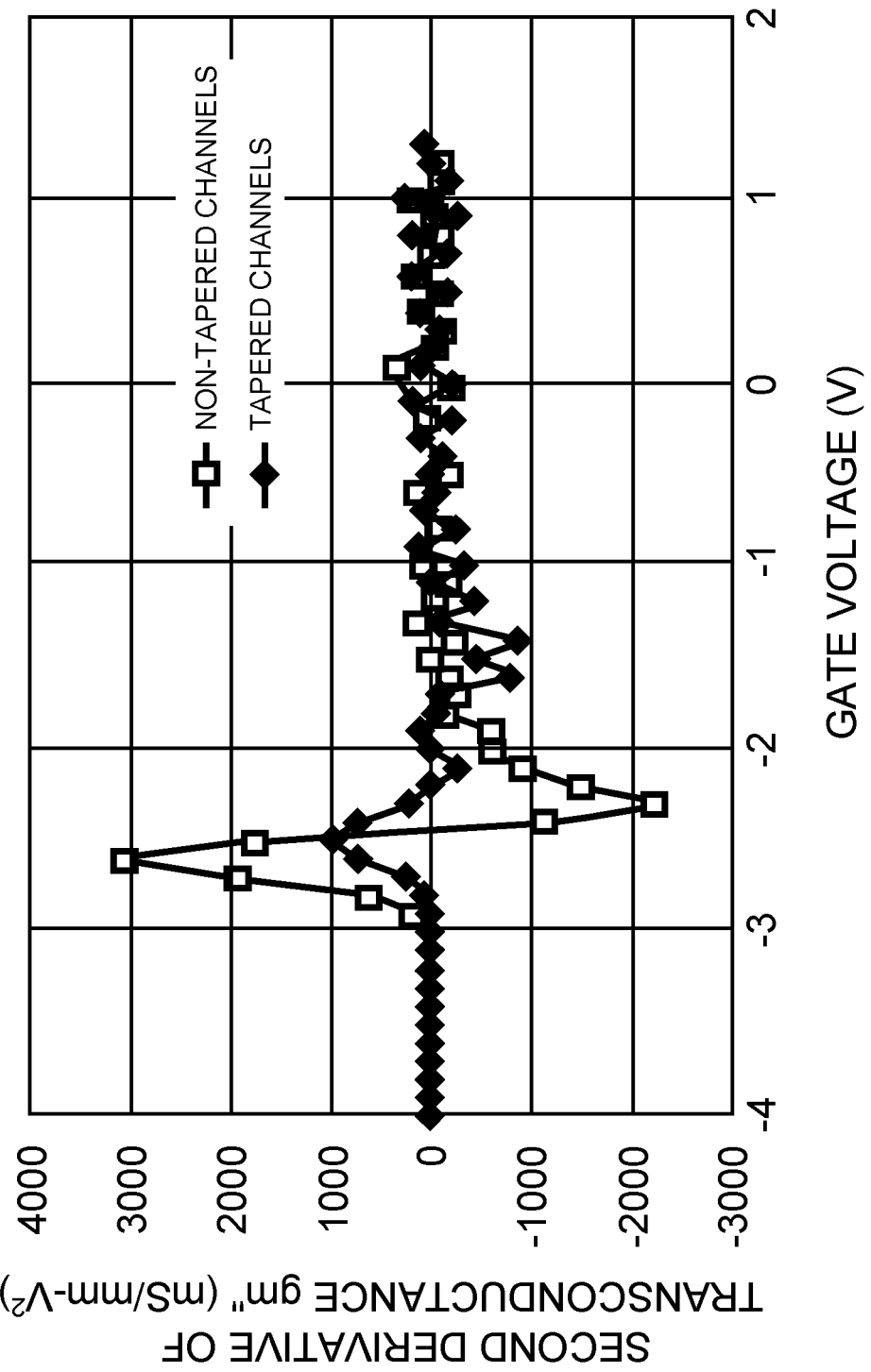
FIG. 13 is a graph of second derivative of transconductance versus voltage for a 64° taper angle for each tapered channel region between pairs of the plurality of gate feet in comparison with non-tapered channel regions.

FIG. 13 is a graph of second derivative of transconductance versus voltage for a 64° taper angle for each tapered channel region 28 between pairs of the plurality of gate feet 26 in comparison with the second derivative of transconductance associated with non-tapered channel regions. Notice that with each tapered channel region 28 the second derivative of transconductance is reduced by more than 66% in comparison with the second derivative of transconductance associated with non-tapered channel regions.

First and second derivatives of transconductance are responsible for a transistor's contribution to undesirable harmonics and intermodulation distortion. As such, the reductions in first and second derivatives of transconductance due to each tapered channel region 28 between pairs of the plurality of gate feet 26 improves linearity of transistors and communication systems that employ transistor amplifiers. Thus, the high electron mobility transistor 10 of the present disclosure is particularly well suited for use in wideband and ultra-wideband radio frequency power amplifiers.

Figure 14:
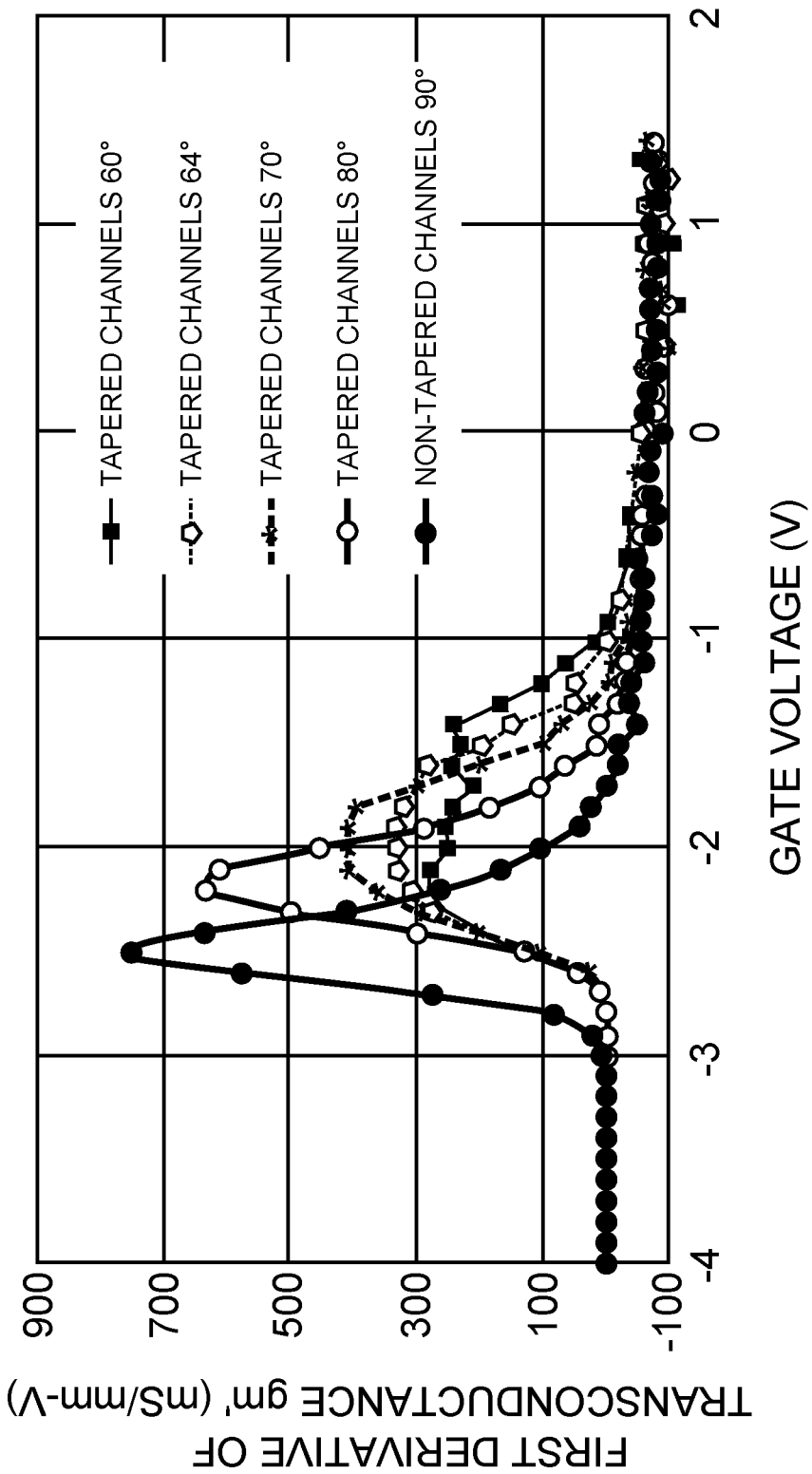
FIG. 14 is a graph of first derivative of transconductance versus gate voltage for various taper angles for each tapered channel region between pairs of the plurality of gate feet.

FIG. 14 is a graph of first derivative of transconductance versus gate voltage for taper angles for each tapered channel region 28 between pairs of the plurality of gate feet 26. Notice that the first derivative of transconductance decreases in magnitude relatively steeply for taper angles between 90° and 70° and decreases in magnitude relatively shallowly for taper angles between 70° and 60°.

Figure 15:
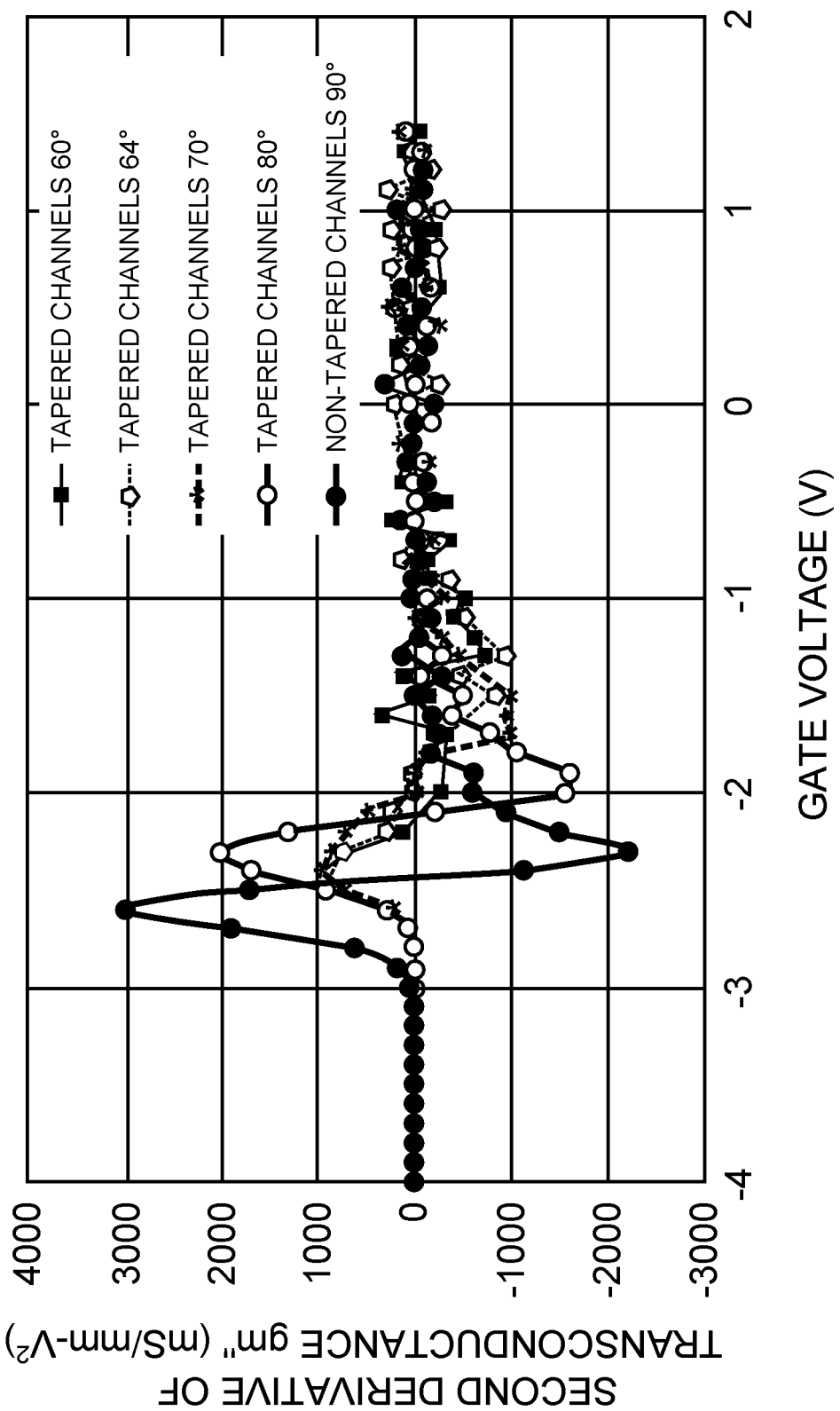
FIG. 15 is a graph of second derivative of transconductance versus voltage for various taper angles for each tapered channel region between pairs of the plurality of gate feet.

FIG. 15 is a graph of second derivative of transconductance versus voltage for various taper angles for each tapered channel region 28 between pairs of the plurality of gate feet 26. Notice that similar to the first derivative of transconductance, the second derivative of transconductance decreases in magnitude relatively steeply for taper angles between 90° and 70° and decreases in magnitude relatively shallowly for taper angles between 70° and 60°. As such, a process window of taper angles between 70° and 60° exists for the high electron mobility transistor 10 of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A high electron mobility transistor comprising:
    a substrate;
    a gallium nitride layer disposed over the substrate;
    a gate contact comprising:
        a gate bus disposed over the gallium nitride layer; and
        a plurality of gate feet extending from the gate bus into the gallium nitride layer, wherein each gate foot of the plurality of gate feet has a trapezoid-shaped cross-section with a longer base and a shorter base in parallel with a longitudinal axis of the gate bus;
    a source contact disposed over the gallium nitride layer; and
    a drain contact disposed over the gallium nitride layer, wherein the source contact and the drain contact are spaced apart from the gate contact and each other.

2. The high electron mobility transistor of claim 1 wherein the plurality of gate feet are spaced longitudinally along the gate bus.

3. The high electron mobility transistor of claim 2 wherein each gate foot of the plurality of gate feet is spaced apart substantially equidistant from each other.

4. The high electron mobility transistor of claim 1 wherein an angle between the longer base and an adjacent leg of the trapezoid-shaped cross-section is between 45° and 80°.

5. The high electron mobility transistor of claim 1 wherein an angle between the longer base and an adjacent leg of the trapezoid-shaped cross-section is between 60° and 70°.

6. The high electron mobility transistor of claim 1 wherein the longer base is proximal to the gate bus and the shorter base is distal of the gate bus.

7. The high electron mobility transistor of claim 1 wherein adjacent pairs of the plurality of gate feet each form a tapered channel region within the gallium nitride layer, wherein a plurality of two-dimensional electron gas channels reside within the tapered channel region and a height of the tapered channel region is substantially equal to a distance between the shorter base and the longer base of the trapezoid-shaped cross-section.

8. The high electron mobility transistor of claim 7 wherein relative channel width within the tapered channel region varies between 0.7 and 1.0 over the height of the tapered channel region.

9. The high electron mobility transistor of claim 7 wherein magnitude of pinch-off voltage within the tapered channel region varies linearly over the height of the tapered channel region.

10. The high electron mobility transistor of claim 7 wherein portions of the gallium nitride layer extend through each tapered channel region to against a bottom surface of the gate bus.

11. The high electron mobility transistor of claim 7 further comprising a dielectric layer sandwiched between portions of the gallium nitride layer that extend through each tapered channel region and a bottom surface of the gate bus.

12. The high electron mobility transistor of claim 11 wherein the dielectric layer comprises air.

13. The high electron mobility transistor of claim 12 wherein the dielectric layer further comprises a solid dielectric.

14. The high electron mobility transistor of claim 11 wherein the dielectric layer is solid.

15. The high electron mobility transistor of claim 14 wherein the dielectric layer comprises silicon dioxide.

16. The high electron mobility transistor of claim 14 wherein the dielectric layer comprises silicon nitride.

17. The high electron mobility transistor of claim 1 wherein a first derivative of transconductance varies no more than ±5% over a gate voltage between −1.2 V and 2.2 V.

18. The high electron mobility transistor of claim 1 wherein a second derivative of transconductance varies no more than ±1000 mS/mm-V$^2$.

19. The high electron mobility transistor of claim 1 wherein the gate contact comprises metal.

20. The high electron mobility transistor of claim 1 wherein the gallium nitride layer has a thickness between 2 μm and 10 μm.

\* \* \* \* \*